United States Patent
Do

(10) Patent No.: US 7,499,356 B2
(45) Date of Patent: Mar. 3, 2009

(54) SEMICONDUCTOR MEMORY DEVICE

(75) Inventor: Chang-Ho Do, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 102 days.

(21) Appl. No.: 11/647,685

(22) Filed: Dec. 28, 2006

(65) Prior Publication Data

US 2007/0260925 A1    Nov. 8, 2007

(30) Foreign Application Priority Data

Apr. 13, 2006    (KR)    ............. 10-2006-0033749

(51) Int. Cl.
*G11C 7/00*    (2006.01)
*G11C 8/00*    (2006.01)

(52) U.S. Cl. ............. 365/201; 365/230.03; 365/230.05; 365/230.06; 365/233

(58) Field of Classification Search ................. 365/201, 365/230.03, 230.05, 230.06, 233
See application file for complete search history.

(56) References Cited

U.S. PATENT DOCUMENTS

| | | | | |
|---|---|---|---|---|
| 5,793,686 | A * | 8/1998 | Furutani et al. | ............. 365/201 |
| 6,122,218 | A | 9/2000 | Kang | |
| 6,166,967 | A * | 12/2000 | Do | ............. 365/201 |
| 6,301,169 | B1 * | 10/2001 | Kikuda et al. | ............. 365/201 |
| 6,560,160 | B1 | 5/2003 | Grace | |
| 6,594,196 | B2 | 7/2003 | Hsu et al. | |
| 6,741,511 | B2 * | 5/2004 | Nakao | ............. 365/201 |
| 6,845,429 | B2 | 1/2005 | Mattausch et al. | |
| 6,934,895 | B2 * | 8/2005 | Yun | ............. 365/201 |
| 7,046,563 | B1 * | 5/2006 | Kim | ............. 365/201 |
| 7,187,195 | B2 * | 3/2007 | Kim | ............. 365/201 |
| 7,269,041 | B2 * | 9/2007 | Kim et al. | ............. 365/230.05 |
| 7,349,272 | B2 * | 3/2008 | Do et al. | ............. 365/201 |
| 2002/0146025 | A1 | 10/2002 | Okina | |
| 2005/0251713 | A1 | 11/2005 | Lee | |

FOREIGN PATENT DOCUMENTS

| | | |
|---|---|---|
| JP | 11-149771 | 6/1999 |
| JP | 11-220366 | 8/1999 |
| JP | 2000-243098 | 9/2000 |
| JP | 2002-230977 | 8/2002 |
| JP | 2005-043226 | 2/2005 |
| KR | 2002-0018878 | 3/2002 |

* cited by examiner

*Primary Examiner*—Trong Pahn
(74) *Attorney, Agent, or Firm*—Blakely, Sokoloff, Taylor & Zafman LLP

(57) ABSTRACT

A semiconductor device includes a plurality of first pads; a plurality of ports for performing a serial data communication with external devices through the first pads; a plurality of banks for performing a parallel data communication with the plurality of ports; a plurality of global data buses for supporting the parallel data communication between the plurality of ports and the plurality of banks; and a test mode controller for performing a core test with various data transfer modes by converting the serial data communication into the parallel data communication during a core test mode.

39 Claims, 12 Drawing Sheets

SEMICONDUCTOR MEMORY DEVICE

FIELD OF THE INVENTION

The present invention relates to a semiconductor memory device, and more particularly, to a semiconductor memory device performing a data communication with external devices using a parallel input/output (I/O) interface or a serial I/O interface during a core test mode.

DESCRIPTION OF RELATED ART

Generally, most memory devices including a random access memory (RAM) have a single port with a plurality of I/O pin sets. The single port is provided for data exchange with an external chipset. The memory device having the single port uses parallel I/O interface for simultaneously transferring data of several bits through signal lines connected to a plurality of I/O pins. That is, data are exchanged with an external device through a plurality of I/O pins in parallel.

The I/O interface is an electrical and mechanical scheme to accurately transfer I/O data by connecting unit devices having different functions through signal lines. I/O interfaces, which will be described later, should be construed as having the same meaning as the above-described I/O interface. In addition, the signal lines represent buses to transfer signals, such as address signals, data signals, and control signals. The signal lines will be referred to as buses for convenience of explanation.

Because the parallel I/O interface simultaneously transfers data of several bits through several buses, it has excellent data processing efficiency (speed). Therefore, the parallel I/O interface is widely used in a short distance transmission requiring a high speed. However, because the parallel I/O interface has a large number of buses for transferring I/O data, the product cost increases as the distance is longer. In terms of hardware of a multimedia system, a plurality of memory devices has to be independently configured in order to support various multimedia functions because of the limitation of the single port. Furthermore, when a certain function is operated, another function cannot be operated at the same time.

To overcome these problems, many efforts have been made to replace the memory devices having the parallel I/O interface with the memory devices having the serial I/O interface. I/O environment of the semiconductor memory device needs to change into the serial I/O interface, considering the expansion of the compatibility with other devices having serial I/O interface. In addition, application devices such as audio or video processors are embedded in display devices, such as high definition television (HDTV) and liquid crystal display (LCD) TV. Because these application devices require independent data processing, there is an increasing demand for a multi-port memory device having a serial I/O interface to transfer data through a plurality of ports.

For reference, there is suggested a semiconductor memory device described in a commonly owned copending application, U.S. Ser. No. 11/528,970, filed on Sep. 27, 2006, entitled "MULTI-PORT MEMORY DEVICE WITH SERIAL INPUT/OUTPUT INTERFACE".

FIG. 1 is a conceptual diagram of a conventional multi-port memory device. In FIG. 1, the multi-port memory device with four ports and eight banks is illustrated. The multi-port memory device has a 16-bit data frame and performs a 64-bit prefetch operation.

The multi-port memory device includes first to fourth ports PORT0 to PORT3, first to eighth banks BANK0 to BANK3 and BANK4 to BANK7, first global data buses GIO_OUT, second global data buses GIO_IN, and first to eighth bank controllers BC0 to BC7. The first to fourth ports PORT0 to PORT3 are arranged at the center portion of the core region in a row direction to independently perform a serial data communication with different target external devices. The first to eighth banks BANK0 to BANK3 and BANK4 to BANK7 are arranged above and under the ports PORT0 to PORT3 in a row direction. The first global data buses GIO_OUT are arranged between the first to fourth banks BANK0 to BANK3 and the first to fourth ports PORT0 to PORT3 in a row direction to transfer data in parallel. The second global data buses GIO_IN are arranged between the fifth to eighth banks BANK4 to BANK7 and the first to fourth ports PORT0 to PORT3 in a row direction to transfer data in parallel. The first to eighth bank controllers BC0 to BC7 control the signal transfer between the first and second global data buses GIO_OUT and GIO_IN and the banks BANK0 to BANK7.

More specifically, as illustrated in FIG. 2, each of the first to eighth banks BANK0 to BANK7 includes a memory cell array 10, a row decoder 11, a column decoder 12, an equalizer (not shown), a write driver 13, and a data bus sense amplifier 14. The memory cell array 10 includes a plurality of memory cells arranged in an N×M matrix (where M and N are positive integers). The first to eighth banks BANK0 to BANK7 bisect the core region. That is, the first to eighth banks BANK0 to BANK7 are symmetrically arranged in such a way that the first to fourth banks BANK0 to BANK3 are arranged above the ports PORT0 to PORT3 in a row direction and the fifth to eighth banks BANK4 to BANK7 are arranged under the ports PORT4 to BANK7 in a row direction. The data buses are bit lines that correspond to column lines.

The first to fourth ports PORT0 to PORT3 are arranged at the center portion of the core region and are connected to the first and second global data buses GIO_OUT and GIO_IN such that they can access all the banks BANK0 to BANK7. In addition, as illustrated in FIG. 3, each of the ports PORT0 to PORT3 independently includes a receiving part 41 for receiving the input signals through the reception pad RX and a transmitting part 42 for transmitting the output signals through a transmission pad TX to the external device, such that the input signals input from an external device (an application device) through a reception pad RX and the output signal output from the banks BANK0 to BANK7 through the first global data buses GIO_OUT can be simultaneously transferred.

The receiving part 41 parallel-converts the input signal of 20-bit frame, which is serially input from the external device through the reception pad RX, into 26-bit valid signals suitable for the operation of the DRAM. The 26-bit valid signals consist of 8-bit port/bank select signals Pi_BK<0:7> (where i is a positive integer corresponding to the number of the ports and is 0 to 3) and 18-bit input valid data signals Pi_RX<0:17> (where i is 0 to 3). In addition, the 18-bit input valid data signals Pi_RX<0:17> consists of one command flag signal, one row address strobe (RAS)/data mask (DM), and 16-bit command/address/data signals. At this point, the 16-bit command/address/data signals are signals that may be recognized as command, address or data.

FIGS. 4A to 4C illustrate frame formats of the signals as a protocol for signal transmission. Specifically, FIGS. 4A to 4C illustrate a basic frame format, a write command frame format, a write data frame format, a read command frame format, a read data frame format, and a command frame format, respectively.

As an example, the write command/data frame format of FIGS. 4B and 4C will be described below.

Referring to FIG. 4B, the write command frame format includes 20-bit serial signal input from the external device. The $19^{th}$ and $18^{th}$ bits "PHY" are physical link coding bits, the $17^{th}$ bit is "CMD", and the $16^{th}$ to $14^{th}$ bits are "ACT" (active) and "WT" (write), and "PCG" (precharge) signals, respectively. "ACT", "WT" and "PCG" represent an internal active signal, an internal write command signal, and an internal inactive signal, respectively. For example, the $17^{th}$ to $14^{th}$ bits are "1010" during a normal write operation and "1011" during an auto-precharge write operation. The $13^{th}$ to $10^{th}$ bits "UDM" are used as an upper-byte write data mask of a write data applied for 4 clocks. The $9^{th}$ to $6^{th}$ bits "BANK" are bank data written during a write operation. The $5^{th}$ to $0^{th}$ bits "COLUMN ADDRESS" are column addresses.

In the write data frame of FIG. 4C, 16-bit write data are input for 4 clocks after the write command frame of FIG. 4B is input. In the write data frame format, the $17^{th}$ bit "CMD" has to be LOW (0), and the $16^{th}$ bit "LDM" means a lower-byte write data mask of the input data. The $15^{th}$ to $8^{th}$ bits "UPPER BYTE" and the $7^{th}$ to $0^{th}$ bits "LOWER BYTE" mean the upper byte and the lower byte of the write data, respectively.

A structure of the receiving part 41 will be described below with reference to FIG. 3.

Referring to FIG. 3, the receiving part 41 includes a parallelizer 411, a command generator 412, a bank address generator 413, a bank address output unit 414, and an input valid data output unit 415.

The parallelizer 411 receives 20-bit (1 frame) input signals that are input as serial signals from the external device through the reception pad RX, and converts the 20-bit input signals into 20-bit parallel signals.

The command generator 412 determines which operation the input signal performs by using the $17^{th}$ bit (command flag bit) among the 20-bit-frame input signals output from the parallelizer 411. That is, when the $17^{th}$ bit in the frame of FIG. 4 is "0", the input signal is determined as a signal for performing the write operation. When the $17^{th}$ bit is "1", the input signal is determined as a signal for performing the read operation. In addition, the command generator 412 outputs bits used as bank data among the bits of the input signal. Because eight banks are provided, 3 bits are used and the bits are contained in the frame payload of FIG. 4.

The bank address generator 413 receives bits (3 bits in this example) from the command generator 412, the bits being used as selection data for selecting the corresponding bank among the banks BANK0 to BANK7, and generates 8-bit bank addresses. To this end, the bank address generator 413 is implemented with a 3×8 decoder to receive the 3-bit input signal and output the 8-bit output signal.

The bank address output unit 414 receives the bank addresses from the bank address generator 413, and transfers the 8-bit bank select signals Pi_BK<0:7> through the second global data buses GIO_IN. The bank address output unit 414 is implemented with a plurality of output drivers. The output drivers are well known to those skilled in the art.

The input valid data output unit 415 receives the 18-bit valid data signals Pi_RX<0:17> from the parallelizer 411 and transfers them through the second global data bus GIO_IN. Like the bank address output unit 414, the input valid data output unit 415 is implemented with a plurality of output drivers.

The transmitting part 42 serializes the output valid data signals Pi_DATA<0:15> (where i is 0 to 3) input from the banks BANK0 to BANK7 through the first global data buses GIO_OUT in parallel.

The transmitting part 42 includes a serializer 421 and an output valid data input unit 422.

The output valid data input unit 422 receives the 16-bit output valid data signals Pi_DATA<0:15> from the banks BANK0 to BANK7 through the first global data buses GIO_OUT in parallel, packetizes the output valid data signals Pi_DATA<0:15>, based on the transfer protocol, under the control of the command generator 412 (the I/O control of the data signals according to the write or read operation), and then generates the output signals with 20-bit frames. The output valid data input unit 422 is implemented with a plurality of input drivers.

The serializer 421 serializes the 20-bit output signals input from the output valid data input unit 422 in parallel, and sequentially outputs the serialized 20-bit output signals through the transmission pad TX.

The first global data buses GIO_OUT include 64 buses (16 (number of data bits)×4 (number of ports)) to independently transfer the output valid data signals Pi_DATA<0:15> input from the banks BANK0 to BANK7 to the ports PORT0 to PORT3 in parallel.

The second global data buses GIO_IN include 104 buses (26 (number of data bits)×4 (number of ports)) to independently transfer the 26-bit signals (18-bit input valid data signals and 8-bit bank select signals) input from the ports PORT0 to PORT3 to the banks BANK0 to BANK7 in parallel.

The first and second global data buses GIO_OUT and GIO_IN are connected to local data buses so as to transfer data to the bank controllers BC0 to BC7 or the ports PORT0 to PORT3. That is, the local data buses connect the first and second global data buses GIO_OUT and GIO_IN to the bank controllers BC0 to BC7 and the ports PORT0 to PORT3. For convenience, the first to fourth local data buses LIO_BOUT, LIO_BIN, LIO_P1 and LIO_P2 are illustrated in FIG. 1.

The bank controllers BC0 to BC7 are installed in the banks one by one so as to manage the respective banks BANK0 to BANK7. The bank controllers BC0 to BC7 manage the signal transfer between the banks BANK0 to BANK7 and the ports PORT0 to PORT3. As illustrated in FIG. 5, each of the bank controllers BC0 to BC7 includes a parallelizer 61, a serializer 62, a state machine 63, an input signal status determiner 64, a bank selector 65, and a port selector 66.

In response to the port/bank select signal P/B_SELECT, the bank selector 65 selects the signals to be input to the corresponding bank among the input valid data signals Pi_RX<0:17> independently input from the ports PORT0 to PORT3, and transfers the selected signals to the corresponding bank. The reason for this operation is that the input valid data signals Pi_RX<0:17> can be simultaneously input from all the ports PORT0 to PORT3 through the second global data buses GIO_IN. At this point, the port/bank select signal P/B_SELECT includes the bank select signal Pi_BK<0:7> output from the bank address output units 414 of the banks BANK0 to BANK3 illustrated in FIG. 3. The bank selector 65 receives the 26-bit signals, including the 18-bit input valid data signals Pi_RX<0:17> input from the ports PORT0 to PORT3 through the first global data buses GIO_IN and the 8-bit port/bank select signals Pi_BK<0:7> for selecting the banks BANK0 to BANK7, and outputs the 18-bit bank valid data signals BRX<0:17>.

Among the 18-bit bank valid data signals BRX<0:17> output from the bank selector 65, 16 bits are used as signals (command signals) for determining status of data, address or bank, 1 bit is used as the active flag signal, and 1 bit is used as the command flag signal for determining whether the 16-bit signals are data signals, address signals, or command signals. As one example, BRX<17> is used as the command flag signal, and BRX<16> is used as the active flag signal. The command flag signal BRX<17> is used as the enable signal of the state machine 63, and the active flag signal BRX<16> is used as the RAS/DM signal serving as the operating signal of the DRAM. RAS is a chip enable signal for controlling the entire DRAM and is an initial operating signal of the DRAM.

The input signal status determiner 64 receives the 18-bit bank valid data signals BRX<0:17> from the bank selector 65 and determines whether the 18-bit bank valid data signals BRX<0:17> are data, address or command signals. Specifically, using the status (0 or 1) of the command flag signal that is the most significant bit of the 18-bit bank valid data signals BRX<0:17>, the input signal status determiner 64 determines whether the 16-bit signals BRX<0:15> except for the seventeenth bit BRX<16> is the data signal, the address signal, or the command signal. When the 16-bit signals BRX<0:15> are not the data signal, the input signal status determiner 64 outputs the 18-bit signals BRX<0:17> to the state machine 63. On the other hand, when the 16-bit signals BRX<0:15> are the data signal, the input signal status determiner 64 outputs the 16-bit signals BRX<0:15> to the parallelizer 61.

The state machine 63 receives the 18-bit bank valid data signals BRX<0:17> from the input signal status determiner 64, and outputs address/command signals ADD/COM for controlling the operation of the DRAM by using the received signals. The internal command signals, the internal address signals, and the internal control signals are generated in response to the address/command signals ADD/COM. The internal command signals include the internal active command signal ACT, the internal inactive command signal PCG, the internal read command signal READ, and the internal write command signal WRITE. The internal address signals include the row addresses XADD and the column addresses YADD. The internal control signals include the input data strobe signals DSTROBE16<0:3> and DSTROBE64, the control signals DRVEN_P<0:3>, the pipe input strobe signals PINSTROBE, and the pipe output control signals POUT<0:3>.

FIG. 6 is a block diagram of the state machine 63 illustrated in FIG. 5.

The state machine 63 includes a command generator 631, an input data strobe generator 632, a row address generator 633, a column address generator 634, a read data pipe controller 635, and a data output controller 636.

The command generator 631 is enabled in response to the most significant bit BRX<17> of the bank valid data signals BRX<0:17>, and decodes the bits BRX<0:15> to generate the internal command signals, such as the internal active command signal ACT, the internal inactive command signal PCG, the internal read command signal READ, and the internal write command signal WRITE. The command generator 631 is implemented with a decoder that receives n digital signals to generate $2^n$ digital signals.

The input data strobe generator 632 generates the input data strobe signals DSTROBE16<0:3> and DSTROBE64 in response to the most significant bit BRX<17> of the bank valid data signals BRX<0:17> and the write command signal WRITE. The input data strobe signals DSTROBE16<0:3> and DSTROBE64 are used as the control signals for controlling the operation of the parallelizer 61.

The row address generator 633 generates the bank valid data signals BRX<0:m> (where m is a positive integer) as the row addresses XADD<0:m> in response (synchronization) to the internal active command signal ACT.

The column address generator 634 generates the bank valid data signals BRX<0:n> (where n is a positive integer) as the column addresses YADD<0:n> in response to the write command signal WRITE and the read command signal READ.

The read data pipe controller 635 generates the pipe input strobe signal PINSTROBE and the pipe output control signals POUT<0:3> in response to the read command signal READ.

The data output controller 636 generates the control signals DRVEN_P<0:3> using the bank select signals Pi_BK<0:7> in response to the read command signal READ. As one example, the signals for selecting the bank BANK0 are specified and indicated by a reference symbol BK0_P<0:3>. The control signals DRVEN_P<0:3> are used as the control signals for controlling the operation of the port selector 66.

The parallelizer 61 parallelizes the bank valid data signals BRX<0:15> transferred from the signal status determiner 64, and outputs the 64-bit parallel signals. That is, while the signals BRX<0:15> transferred from the input signal status determiner 64 are input in the previously parallelized signal format, 64-bit data are read or written in the memory cell regions of the banks BANK0 to BANK7. Therefore, 16-bit data need to be converted into 64-bit data.

The serializer 62 receives the 64-bit data signals from the 64 data bus sense amplifiers 14 connected to the data buses of the banks, and serializes the 64-bit data signals into 16-bit data signals DO<0:15> in response to the pipe input strobe signal PINSTROBE and the pipe output control signals POUT<0:3>.

As illustrated in FIG. 5, the port selector 66 sequentially receives the data signals DO<0:15> from the serializer 62 by 16 bits, and outputs the output valid data signals Pi_DATA<0:15> to the port selected by the port/bank select signal P/B_SELECT.

The port selector 66 is implemented with demultiplexers (DEMUX). The demultiplexers are allocated to the respective ports PORT0 to PORT3 such that they can perform the signal transfer independently of all the ports PORT0 to PORT3. In addition, each of the respective demultiplexers includes 16 drivers so as to process the 16-bit data signals DO<0:15>.

Because the signals output from the banks BANK0 to BANK7 to the ports PORT0 to PORT3 are shared through the first global data buses GIO_OUT by all the banks BANK0 to BANK7, it is preferable that the respective drivers be implemented with tri-state buffers so as not to affect other banks.

An operation of the multi-port memory device will be described below.

FIG. 7 is a diagram illustrating the transfer path of the input signal Pi_BK<0:7> from the ports PORT0 to PORT3 to the banks BANK0 to BANK7, and FIG. 8 is a diagram illustrating the transfer path of the output signals Pi_DATA<0:15> from the banks BANK0 to BANK7 to the ports PORT0 to PORT3. In FIG. 7, BKj_P<0:3> (where j is 0 to 7) represents a signal identical to the bank select signal Pi_BK<0:7>, but is indicated by a different reference symbol for convenience of explanation.

First, the transfer path of the input signals from the first port PORT0 to the second bank BANK1 will be described below.

Referring to FIG. 7, the 18-bit input signals (except for the physical link coding bit) are serially input from the external device through the reception pad RX to the first port PORT0. The first port PORT0 converts the 18-bit input signals into the 26-bit valid signals and transfers them through the second global data buses GIO_IN. Because the second global data buses GIO_IN are connected to all the banks BANK0 to BANK7 through the second local data buses LIO_BIN (see FIG. 1), the 26-bit valid signals are transferred to the bank selectors 65 (see FIG. 5) of the banks BANK0 to BANK7 through the second local data buses LIO_BIN.

Because the 26-bit valid signals transferred from the first port PORT0, especially the input valid data signals P0_RX<0:17>, have to be transferred only to the second bank BANK1, it is necessary to prevent the signals from being transferred to all the banks BANK0 and BANK2 to BANK7 other than the second bank BANK1. For this purpose, the bank select signals P0_BK<0:7> are used.

The bank select signals P0_BK<0:7> consists of the 26-bit valid signals provided from the port PORT0 together with the input valid data signals P0_RX<0:7>. The bank select signals P0_BK<0:7> are input to the bank selector 65 of the second bank BANK1 through the second global data buses GIO_IN together with the input valid data signals P0_RX<0:17> and controls the bank selector 65.

The bank selector 65 for managing the input signal transfer of the second bank BANK1 is enabled in response to the bank select signals P0_BK<0:7>, that is, BK1_P<0:3>, receives the input valid data signals P0_RX<0:17> through the second global data buses GIO_IN, and transfers the received signals P0_RX<0:17> to the second bank BANK1. At this point, because the remaining bank select signals BK0_P<0:3> and BK2_P<0:3> to BK7_P<0:3> are deactivated to a logic high state or a logic low state, the bank selectors 65 of the banks BANK0 and BANK2 to BANK7 are not enabled, so that the input valid data signals P0_RX<0:17> are not transferred to the banks BANK0 and BANK2 to BANK7.

Next, the transfer path of the output signals from the second bank BANK1 to the first port PORT0 will be described below.

Referring to FIG. 8, the 64-bit data signals output from the second bank BANK1 are serialized into the 16-bit data signals DO<0:15> by the serializer 62 of the second bank controller BC1, and the 16-bit data signals DO<0:15> are output to the port selector 66, for example, the demultiplexer. The demultiplexer transfers the data signals DO<0:15> as the output valid data signals P0_DATA<0:15> through the first global data buses GIO_OUT in response to the activated control signals DRVEN_P<0> among the control signals DRVEN_P<0:3>.

The output valid data signals transferred through the first global data buses GIO_OUT are transferred to the first port PORT0 through the third local data buses LIO_P1.

Next, the normal read operation of the multi-port memory device will be described. The normal read operation is to read data from a specific address of a corresponding bank.

Referring to FIG. 1, the input signals (see FIGS. 4D and 4E) corresponding to the read operation are serially input to the first port PORT0 through the reception pad RX, and the parallelizer 411 parallelizes the input signals to output the 26-bit valid signals.

The 26-bit valid signals output from the first port PORT0 are input through the second global data buses GIO_IN to the bank selector 65 of the second bank controller BC1 managing the second bank BANK1. At this point, because the bank selector 65 of the second bank controller BC1 is connected to the second global data buses GIO_IN through the second local data buses LIO_BIN, the signals are also received from the second to fourth ports PORT1 to PORT3 as well as the first bank BANK0.

Accordingly, the 26-bit valid signals input from the ports PORT0 to PORT3 contain the 8-bit bank select signals Pi_BK<0:7>, the corresponding banks are selected by the bank select signals Pi_BK<0:7>. Because only the bank select signal P0_BK<1> is activated, the second bank controller BC1 of the bank BANK1 does not receive the 26-bit signals (which are not valid signals) from the second to fourth ports PORT1 to PORT3, but receives the input valid data signals P0_RX<0:17> from the first port PORT0.

The state machine 63 of the second bank controller BC1 activates the internal active signal ACT and the read command signal READ by using the input valid data signals P0_RX<0:17>, generates the row/column addresses XADD and YADD of the second bank BANK1 through the row/column address generators 633 and 634 by using the activated internal active signal ACT and the activated read command signal READ, activates the pipe input strobe signal PIN-STROBE and the pipe output control signal POUT through the read data pipe controller 635, and activates the control signal DRVEN_P through the data output controller 636.

In response to the read command signal READ input from the second bank controller BC1, the 64-bit data from the second bank BANK1 are amplified by the 64 data bus sense amplifiers through the data lines, and are output to the serializer 62.

The 64-bit output signals input to the serializer 62 are serialized into 16-bit signals in response to the pipe input strobe signal PINSTROBE and the pipe output control signals POUT<0:3>. That is, the serializer 62 converts the 64-bit output signals into four unit serial signals each of which are 16 bits, temporarily stores them, and sequentially outputs them to the port selector 66 by units of 16 bits.

The port selector 66 sequentially outputs the data signals DO<0:15> as the output valid data signals P0_DATA<0:15> by units of 16 bits to the selected port PORT0 through the first global data buses GIO_OUT in response to the control signals DRVEN_P<0:3> which correspond to the bank select signals BK0_P<0:3> as illustrated in FIG. 5.

As illustrated in FIG. 3, the first port PORT0 receives the output valid data signals P0_DATA<0:15> through the first global data buses GIO_OUT in parallel. The output valid data signals P0_DATA<0:15> are serialized by the serializer 421 and are transferred to the corresponding external device through the transmission pad TX.

Next, the normal write operation of the multi-port memory device will be described. The normal write operation is to write data to a specific address of the corresponding bank. The input signals of four frames are received from the reception pad RX. The first frame corresponds to the command signal (hereinafter, referred to as a command frame) (see FIG. 4B), and the remaining three frames correspond to data signals (hereinafter, referred to as data frames) (see FIG. 4C). Each of the input signals is 16 bits. That is, the input signals are 64 bits.

Referring to FIG. 1, the command frame and the data frames corresponding to the write operation are serially input to the first port PORT0 through the reception pad RX, and the parallelizer 411 parallelizes the serial frame signals to output the 26-bit valid signals.

The 26-bit valid signals output from the first port PORT0 are input through the second global data buses GIO_IN to the bank selector 65 of the second bank controller BC1 managing the second bank BANK1. At this point, because the bank selector 65 of the second bank controller BC1 is connected to all the second global data buses GIO_IN through the second local data buses LIO_BIN, the signals are also received from the second to fourth ports PORT1 to PORT3 as well as the first bank BANK0.

Accordingly, the 26-bit valid signals input from the ports PORT0 to PORT3 contain the 8-bit bank select signals Pi_BK<0:7>, the corresponding banks are selected by the bank select signals Pi_BK<0:7>. Because only the bank select signal P0_BK<1> is activated, the second bank controller BC1 of the second bank BANK1 does not receive the 26-bit signals (which are not valid signals) from the second to fourth ports PORT1 to PORT3, but receives the input valid data signals P0_RX<0:17> from the first port PORT0.

The state machine 63 of the second bank controller BC1 activates the internal active signal ACT and the write command signal WRITE by using the input valid data signals P0_RX<0:17>, generates the row/column addresses XADD and YADD of the bank BANK1 through the row/column address generators 633 and 634 by using the activated internal active signal ACT and the activated write command signal WRITE, and activates the input data strobe signal DSTROBE16<0:3> and DSTROBE64 through the input data strobe generator 632.

In this state, the 16-bit bank valid data signals BRX<0:15> corresponding to the valid data signals among the valid data signals BRX<0:15> of the three data frames signals consecutively input are parallelized into the 64 bits (16×4) by the parallelizer 61 (see FIG. 6). Simultaneously, the 64-bit signals are written to the memory cell array 10 of the bank BANK1 through the write driver W/D.

As described above, when the four frame signals (command frame and data frames) are consecutively input to one bank during the write operation, the 64 data bits are simultaneously written to the memory cells. If other command (interrupted operation) is executed before four frames are all input, only data input until that time are written to the memory cells.

Such a multi-port memory device including the plurality of ports requires a test device which operates at a high speed so as to test the ports supporting a serial I/O interface at a high speed. However, the conventional test device can not support the serial I/O interface at high speeds so that time for testing the multi-port memory device increases.

Accordingly, to reduce the time for testing the multi-port memory device, it requires converting the serial I/O interface into a parallel I/O interface.

SUMMARY OF THE INVENTION

It is, therefore, an object of the present invention to provide a multi-port memory device which performs a high speed serial data communication with external devices. The multi-port memory device can support various I/O data transfer modes such as a single data rate (SDR), a double data rate (DDR) and a quadruple data rate (QDR) and reduce a time for testing the multi-port memory device by performing a core test in a parallel I/O interface.

It is, therefore, another object of the present invention to provide a semiconductor memory device which performs a data communication in a parallel I/O interface. The semiconductor memory device can support various I/O data transfer modes during a test mode and reduce a time for testing a multi-port memory device.

In accordance with an aspect of the present invention, there is provided a semiconductor memory device including: a plurality of first pads; a plurality of ports for performing a serial data communication with external devices through the first pads; a plurality of banks for performing a parallel data communication with the plurality of ports; a plurality of global data buses for supporting the parallel data communication between the plurality of ports and the plurality of banks; and a test mode controller for performing a core test with various data transfer modes by converting the serial data communication into the parallel data communication during a core test mode.

In accordance with another aspect of the present invention, there is provided a semiconductor memory device performing a parallel data communication with an external device, the semiconductor memory device including: a mode setting unit for generating a mode setting signal in response to a mode register enable signal input through a plurality of first pads in parallel during a core test mode; a clock generating unit for receiving an external clock signal and generating first and second internal clock signals in response to the mode setting signal; and a test input/output (I/O) control unit for controlling an input and output of an input/output (I/O) data signal through a plurality of second pads during the core test mode in synchronization with the first and second internal clock signals.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device in accordance with exemplary embodiments of the present invention will be described in detail with reference to the accompanying drawings.

Figure 1:
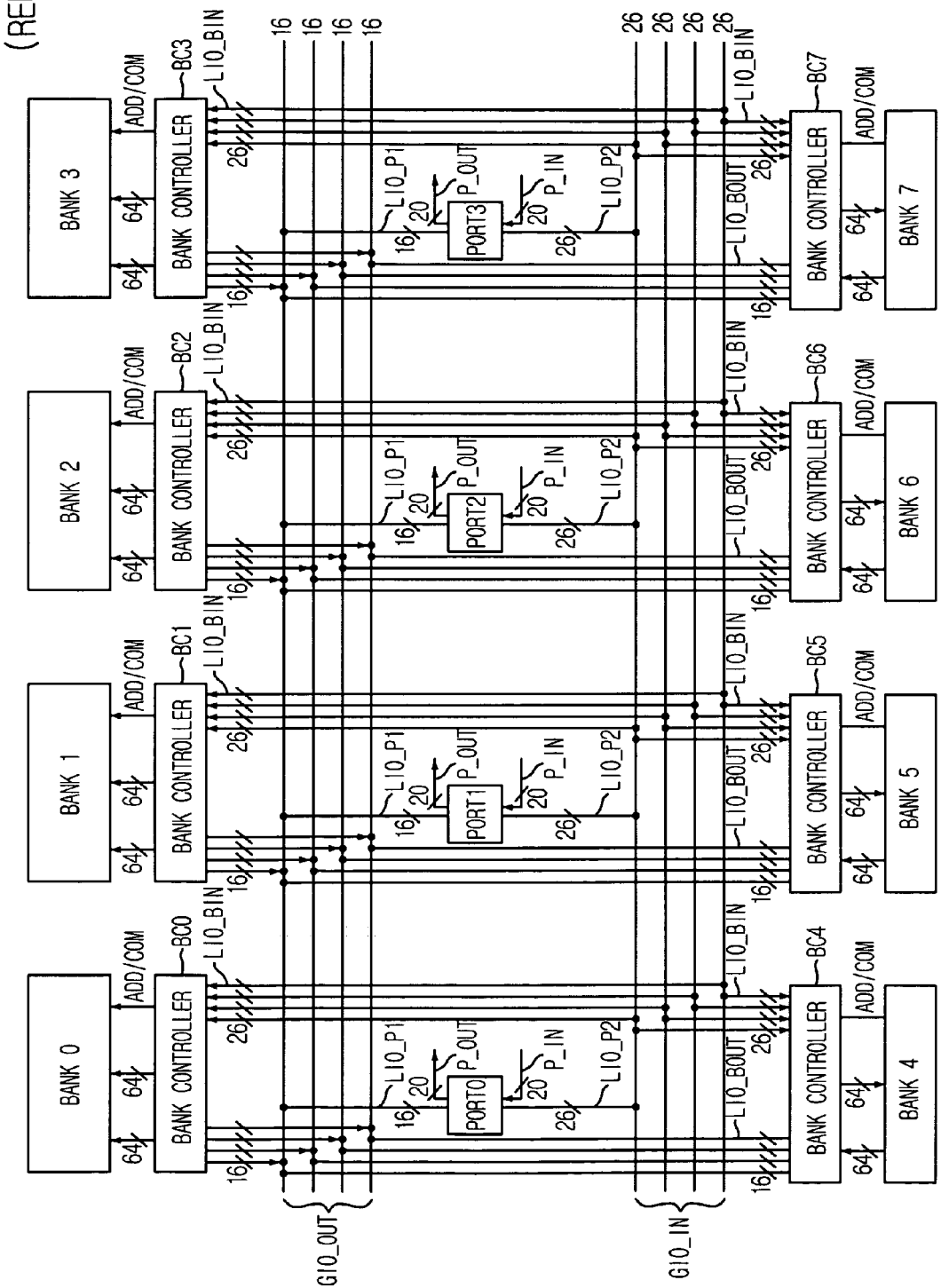
FIG. 1 is a block diagram of a conventional multi port memory device.
Figure 2:
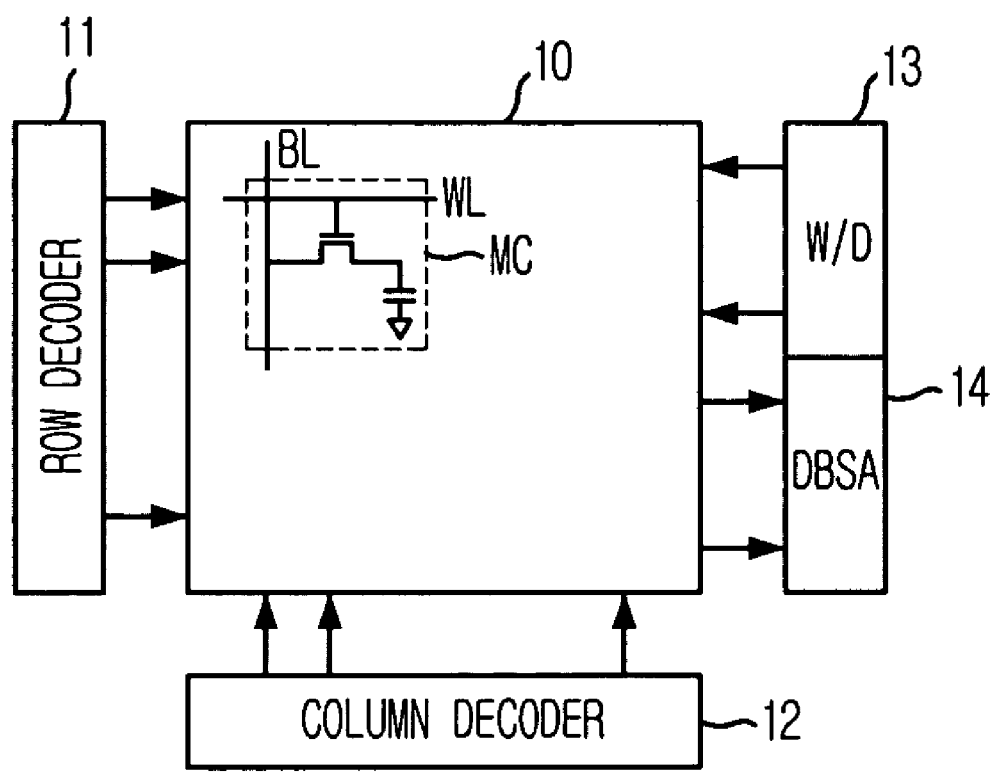
FIG. 2 is a schematic diagram of a bank illustrated in FIG. 1.
Figure 3:
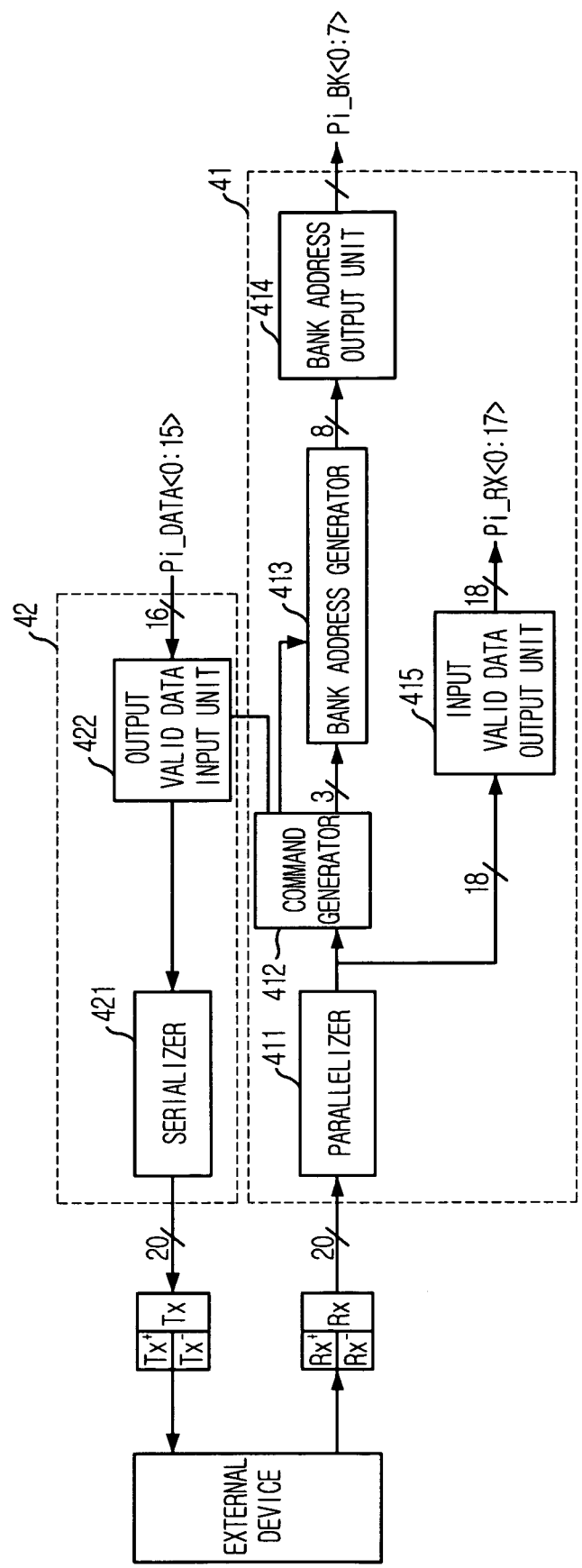
FIG. 3 is a block diagram of a port illustrated in FIG. 1.
Figure 4A:
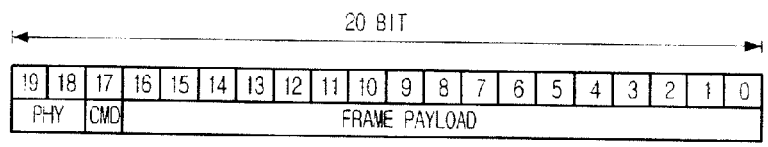
FIGS. 4A-4C are diagrams illustrating a frame format of a signal input to the port of FIG. 1.
Figure 4B:
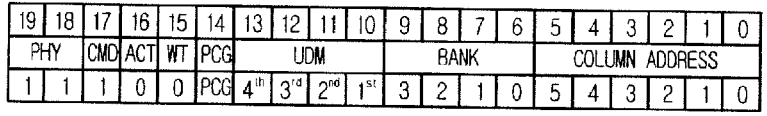
Figure 4C:
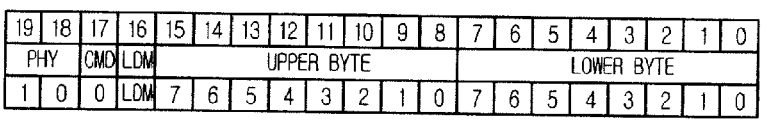
Figure 5:
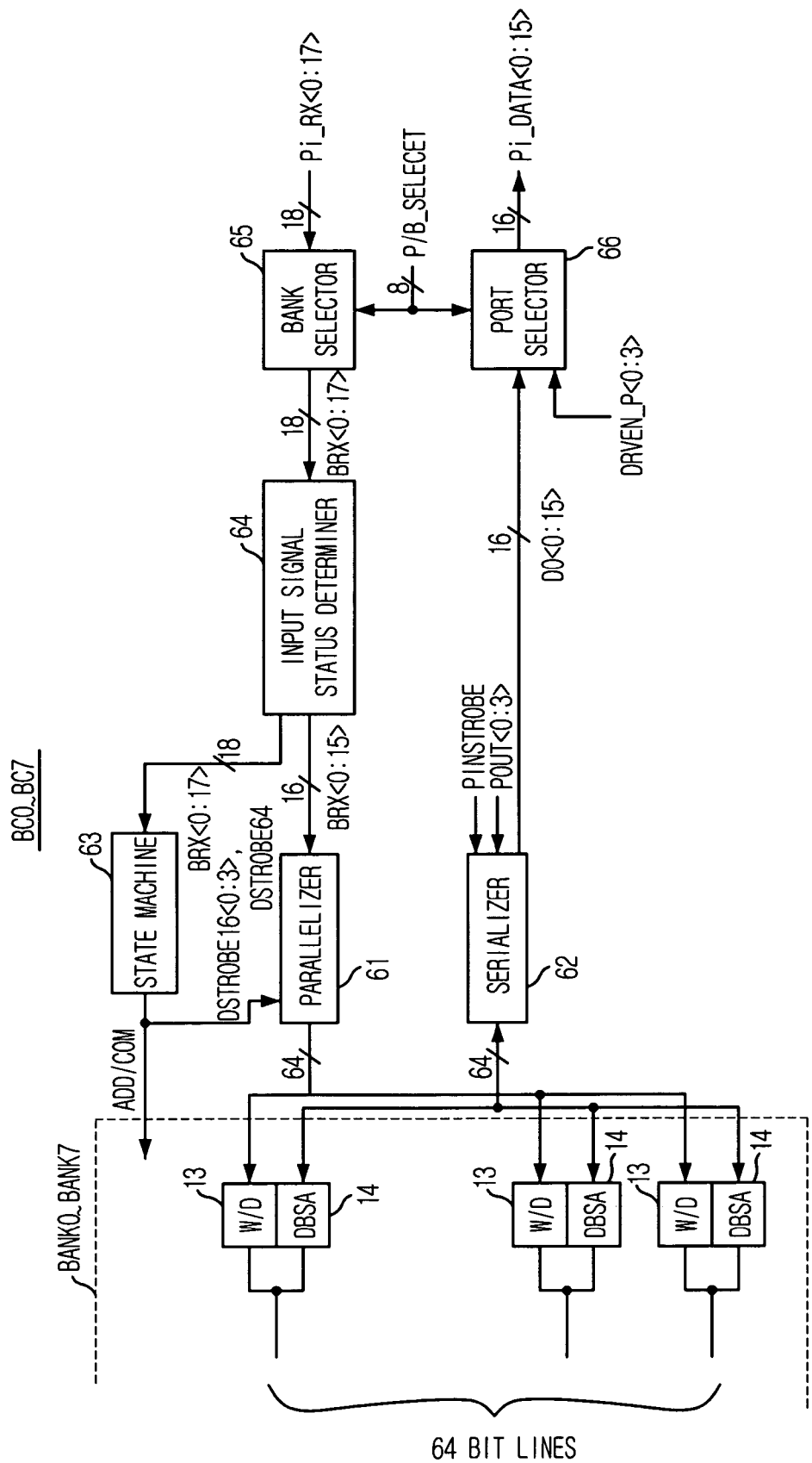
FIG. 5 is a block diagram of a bank controller illustrated in FIG. 1.
Figure 6:
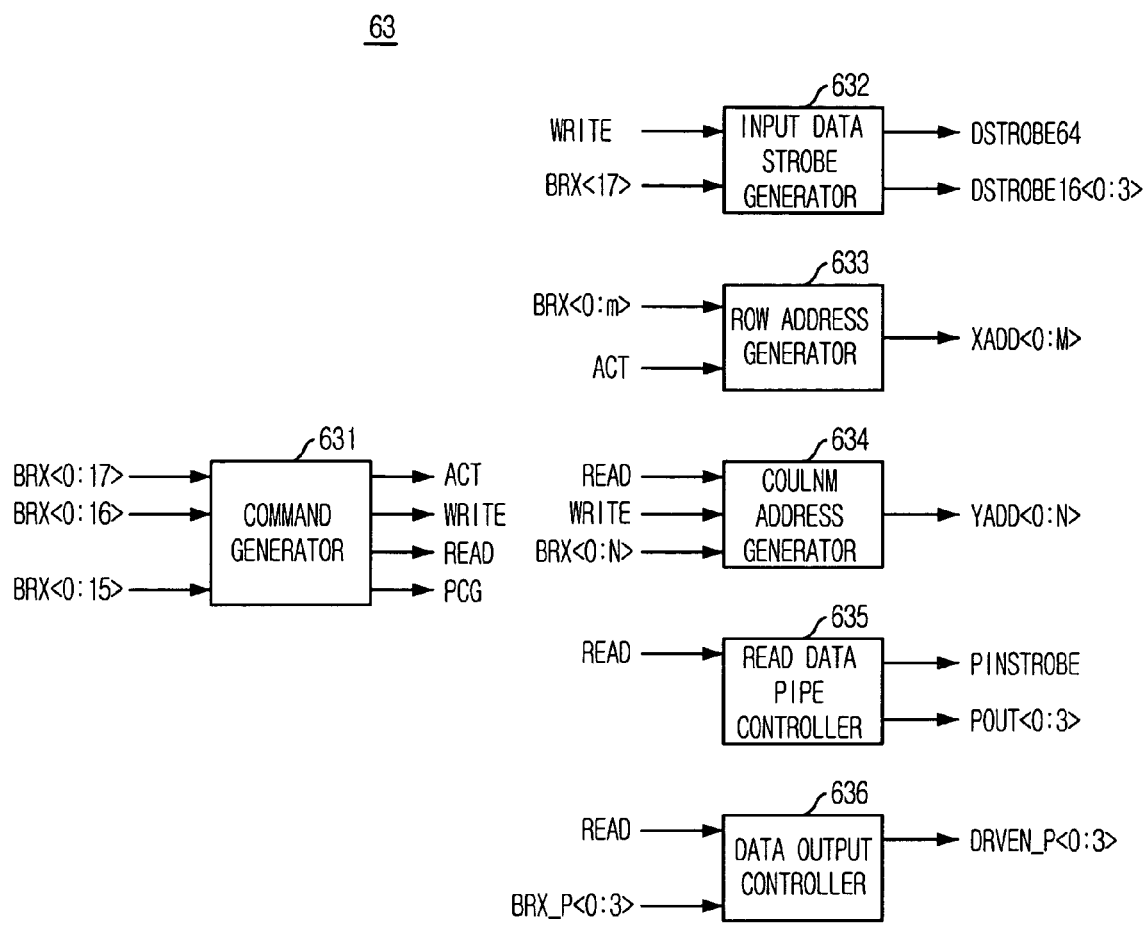
FIG. 6 is a block diagram of a state machine illustrated in FIG. 5.
Figure 7:
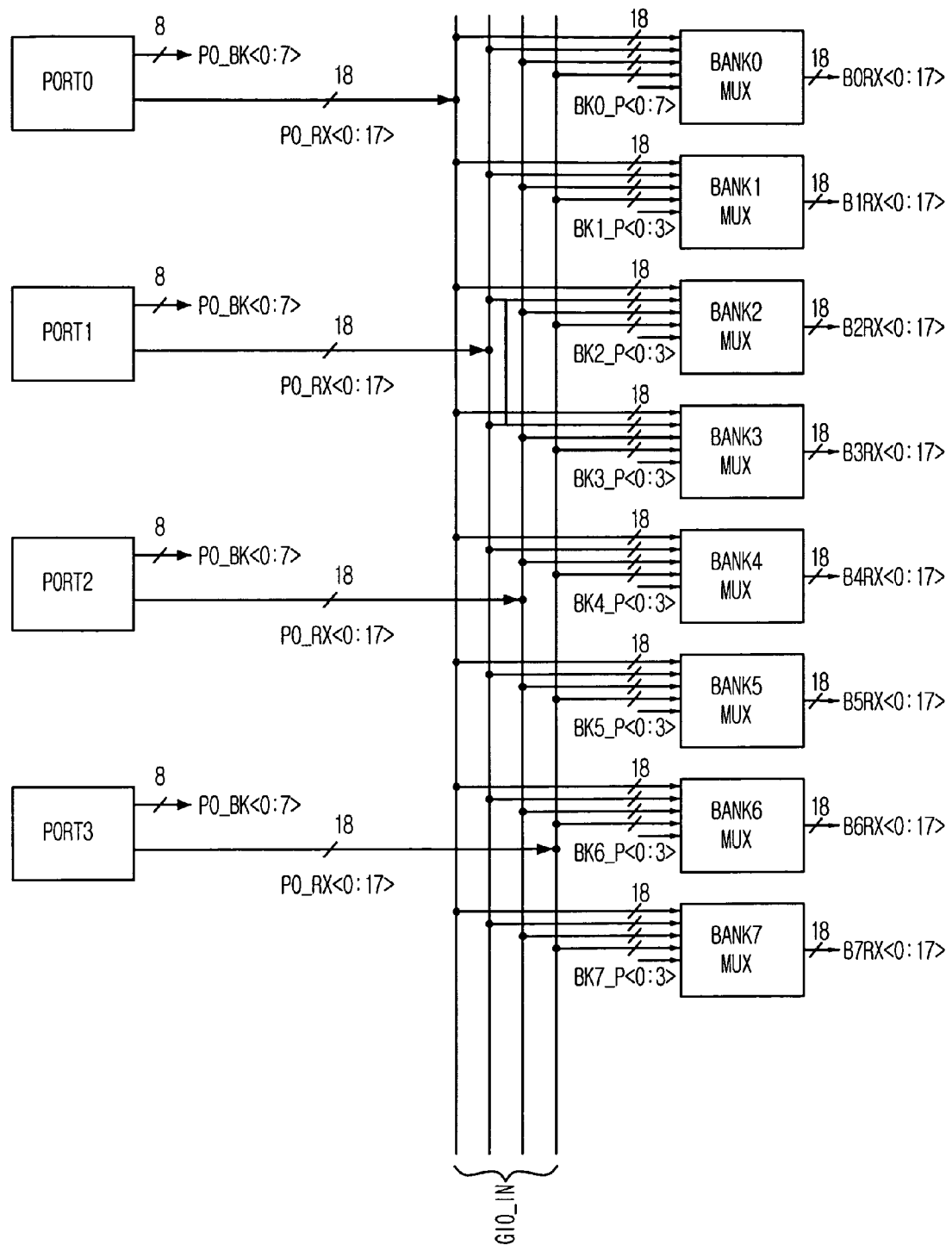
FIG. 7 is a diagram illustrating a transfer path of an input signal from the port to the bank.
Figure 8:
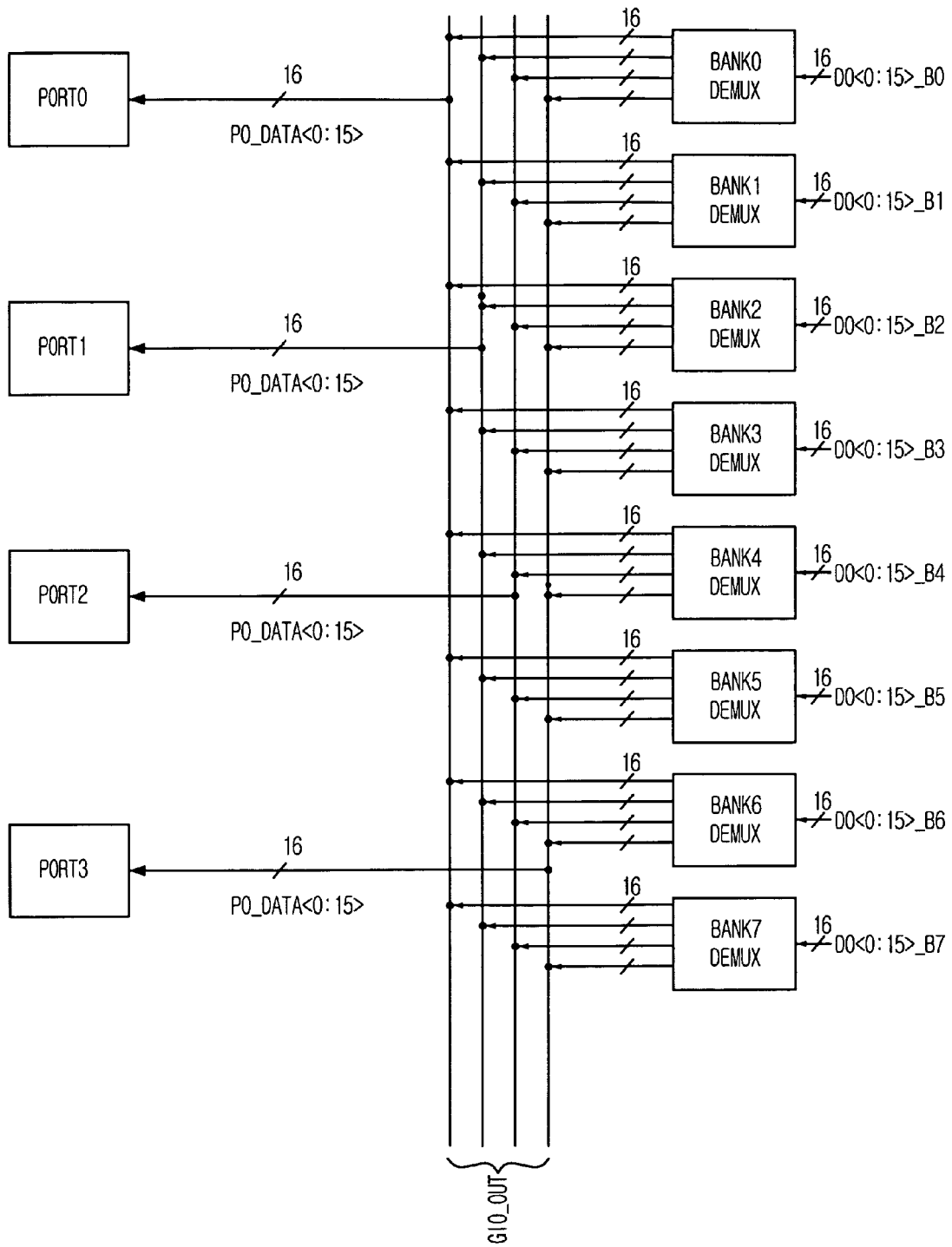
FIG. 8 is a diagram illustrating a transfer path of an output signal from the bank to the port.
Figure 9:
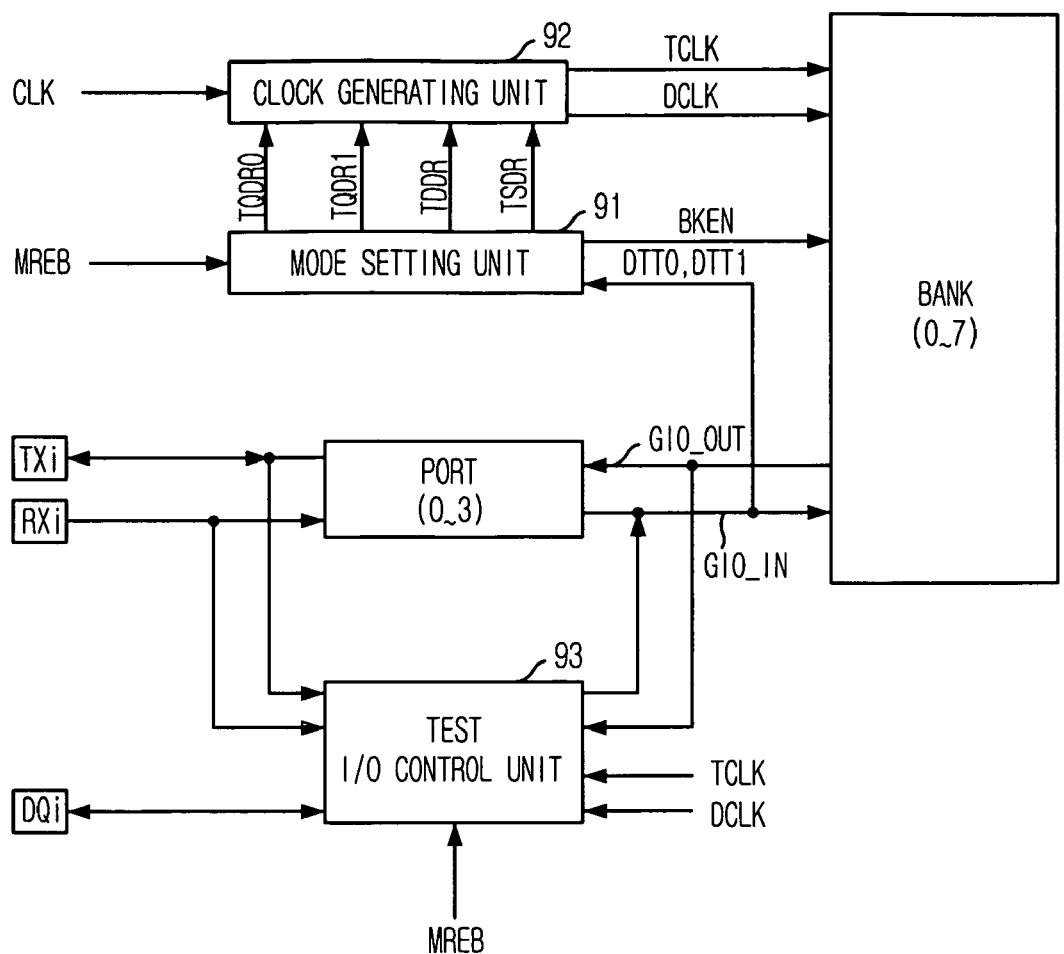
FIG. 9 is a block diagram of a multi port memory device in accordance with an embodiment of the present invention.

FIG. 9 is a block diagram of a multi-port memory device in accordance with an embodiment of the present invention. Normal operation of the invented multi-port memory device is substantially the same as that of the conventional multi-port memory device. Hereinafter, a DRAM core test mode of the multi-port memory device is explained.

The multi-port memory device includes a mode setting unit 91, a clock generating unit 92 and a test input/output (I/O) control unit 93. The mode setting unit 91 outputs first to fourth mode setting signals TQDR0, TQDR1, TDDR, and TSDR in response to a mode register enable signal MREB and first and second data transfer mode selection signal DTT0 and DTT1. Herein, the mode register enable signal MREB is enabled during the DRAM core test mode. The clock generating unit 92 receives an external clock signal CLK from an external pad and generates first and second internal clock signals TCLK and DCLK in response to the first to fourth mode setting signals TQDR0, TQDR1, TDDR, and TSDR. The test I/O control unit 93 receives external signals such as commands, addresses, and control signals (hereinafter, referred to as a test signal) in parallel through transmission pads TXi and reception pads RXi and an input data signal from test pads DQi to transfer them to banks through a first global data bus GIO_IN in response to the mode register enable signal MREB. Herein, 'i' is a positive integer and data are input/output in serial through the transmission pads TXi and reception pads RXi during a normal operation.

In detail, the mode setting unit 91 enters the multi-port memory device into the DRAM core test mode based on the mode register enable signal MREB input through an external pad, and decodes the first and second data transfer mode selection signal DTT0 and DTT1 input through the first global data bus GIO_IN from the test I/O control unit 93 to output the first to fourth mode setting signals TQDR0, TQDR1, TDDR, and TSDR. Herein, the first and second data transfer mode selection signals DTT0 and DTT1 correspond to two preset bits among a plurality of bits constituting the test signal input through the transmission pads TXi and the reception pads RXi. Further, the mode setting unit 91 outputs a bank selection signal BKEN by decoding an external control signal input from another external pad except for the test pads DQi, the transmission pads TXi and the reception pads RXi.

The test I/O control unit 93 receives the test signal through the transmission pads TXi and the reception pads RXi from ports to transfer them to the first global data bus GIO_IN in response to the mode register enable signal MREB. Further, the test I/O control unit 93 receives the input data signal through the test pads DQi to transfer it to the first global data bus GIO_IN in synchronization with the first and second internal clock signals TCLK and DCLK having a different period according to a data transfer mode, or receives an output data signal through a second global data bus GIO_OUT from the banks to output it to the test pads DQi in synchronization with the first and second internal clock signals TCLK and DCLK.

Figure 10:
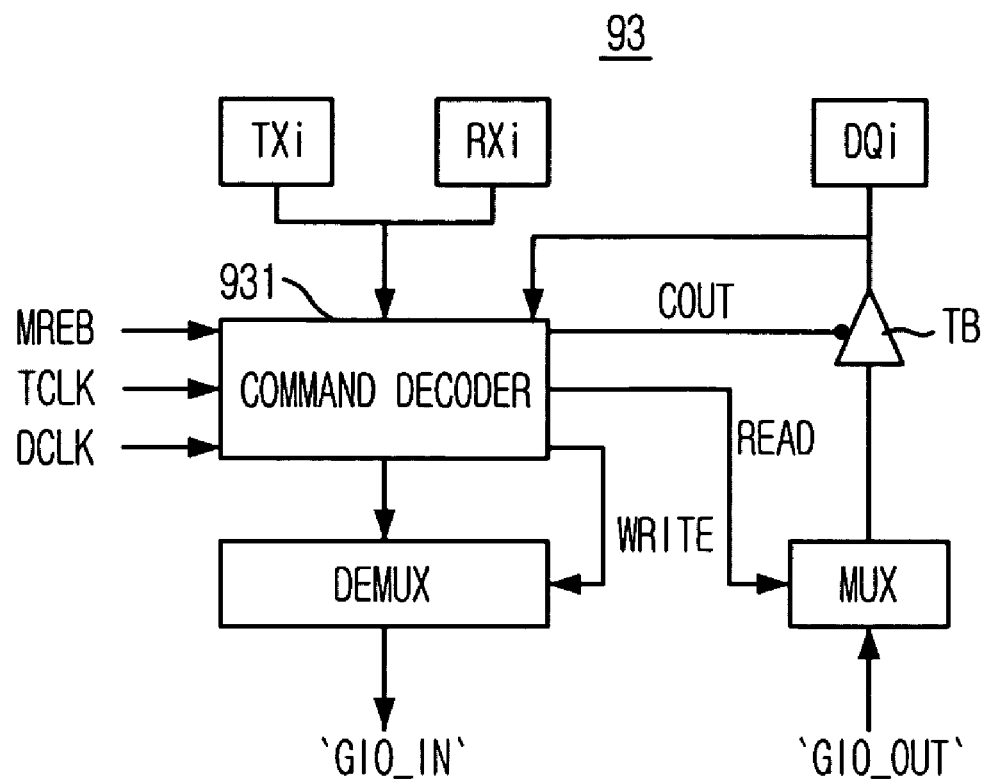
FIG. 10 is a block diagram of a test I/O controller illustrated in FIG. 9.

FIG. 10 is a block diagram of the test I/O controller 93 illustrated in FIG. 9.

The test I/O controller 93 includes a command decoder 931, a demultiplexer DEMUX, a multiplexer MUX, and a tri-state buffer TB. The command decoder 931 decodes the test signal input through the transmission pads TXi and the reception pads RXi to generate internal command signals such as a write command WRITE, a read command READ and a buffer control signal COUT in response to the mode register enable signal MREB. Further, the command decoder 931 buffers the input data signal input through the test pads DQi to output the buffered input data signal to the demultiplexer DEMUX.

The demultiplexer DEMUX transfers the buffered input data signal to the first global data bus GIO_IN in response to the write command WRITE. For example, if the write signal WRITE is activated with a logic high level, the demultiplexer DEMUX transfers the buffered input data signal to the first global data bus GIO_IN.

The multiplexer MUX receives the output data signal through the second global data bus GIO_OUT to output the output data signal to the tri-state buffer TB in response to the read command READ. For example, if the read command READ is activated with a logic high level, the multiplexer MUX transfers the output data signal from the second global data bus GIO_OUT to the tri-state buffer TB.

The tri-state buffer TB buffers and outputs the output data signal from the multiplexer MUX in response to the buffer control signal COUT, or bypasses the input data signal input through the test pads DQi to the command decoder 931. For example, if the buffer control signal COUT is activated with a logic high level, the tri-state buffer TB outputs the output data signal output from the multiplexer MUX to the test pads DQi. If the buffer control signal COUT is deactivated with a logic low level, the tri-state buffer TB bypasses the input data signal input through the test pads DQi to the command decoder 931.

During the normal mode, the output data signal read from the banks is transferred to a corresponding port through the second global data bus GIO_OUT, and then the output data signal is transmitted to the external devices through the transmission pads TXi. In addition, an input signal input from the external devices in serial is input to the ports through the reception pads RXi, and then the input signal is transferred to the banks through the first global data bus GIO_IN.

As described above, in the multi-port memory device, the ports only receive the input signal from the reception pads RXi. Accordingly, test I/O controller 93 is required to transfer the test signal input through the transmission pads TXi and the reception pads RXi from an external test device in parallel, to the first global data bus GIO_IN during the DRAM core test mode.

Meanwhile, the reception pads RXi are used as an input pad for receiving the input signal during the normal mode, and also used as an input pad for receiving the test signal during the DRAM core test mode. Accordingly, each port is configured not to receive the test signal during the DRAM core test mode, or, even if each port receives the test signal during the DRAM core test mode, it is configured not to transfer the test signal to the first global data bus GIO_IN. For example, the ports are controlled by the mode register enable signal MREB. That is, the test signal is not transferred to the first global data bus GIO_IN by enabling the mode register enable signal MREB with a logic low level during the DRAM core test mode.

Each bank is configured to perform read and write operations in synchronization with the first and second internal clock signals TCLK and DCLK output from the clock generating unit 92.

Figure 11:
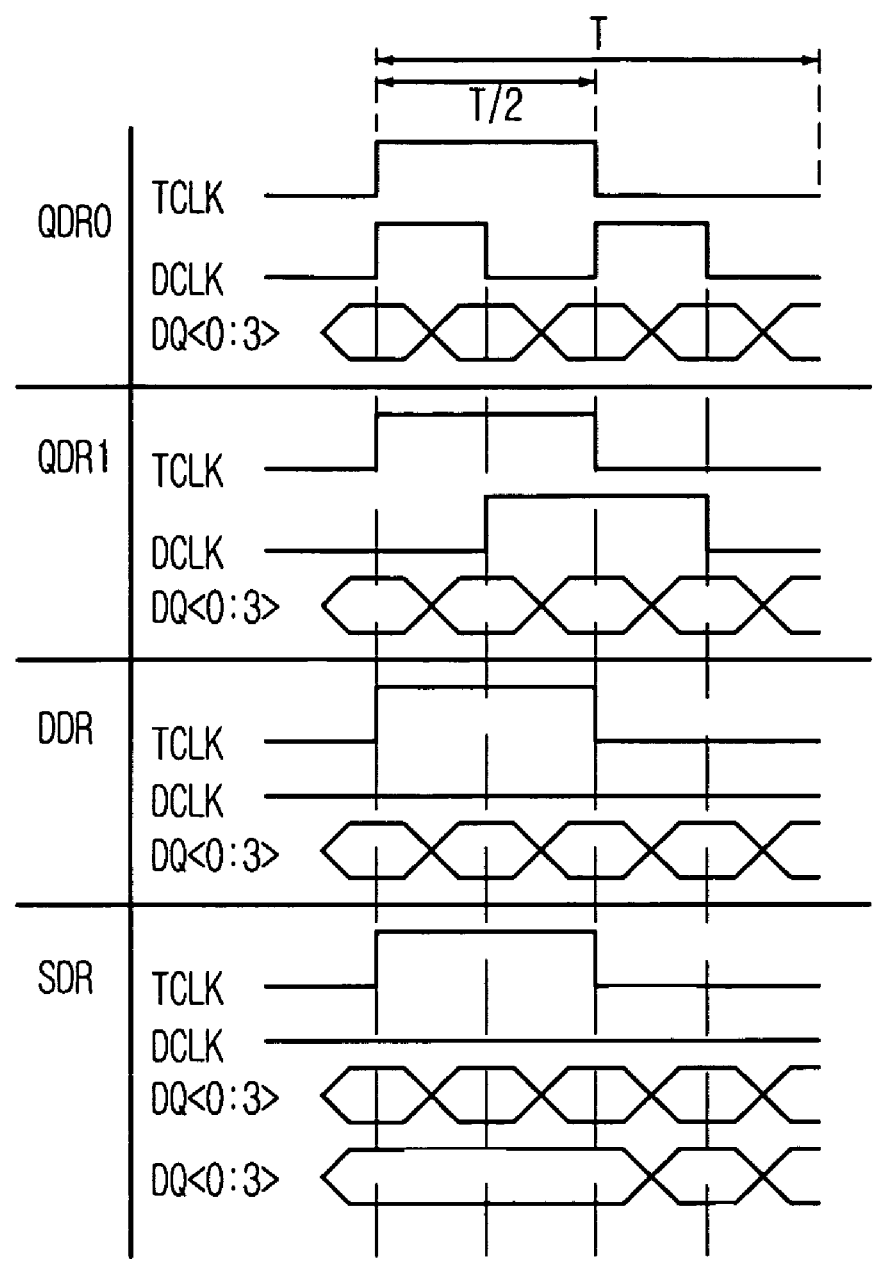
FIG. 11 is a diagram illustrating a write operation classified by various data transfer modes.
Figure 12:
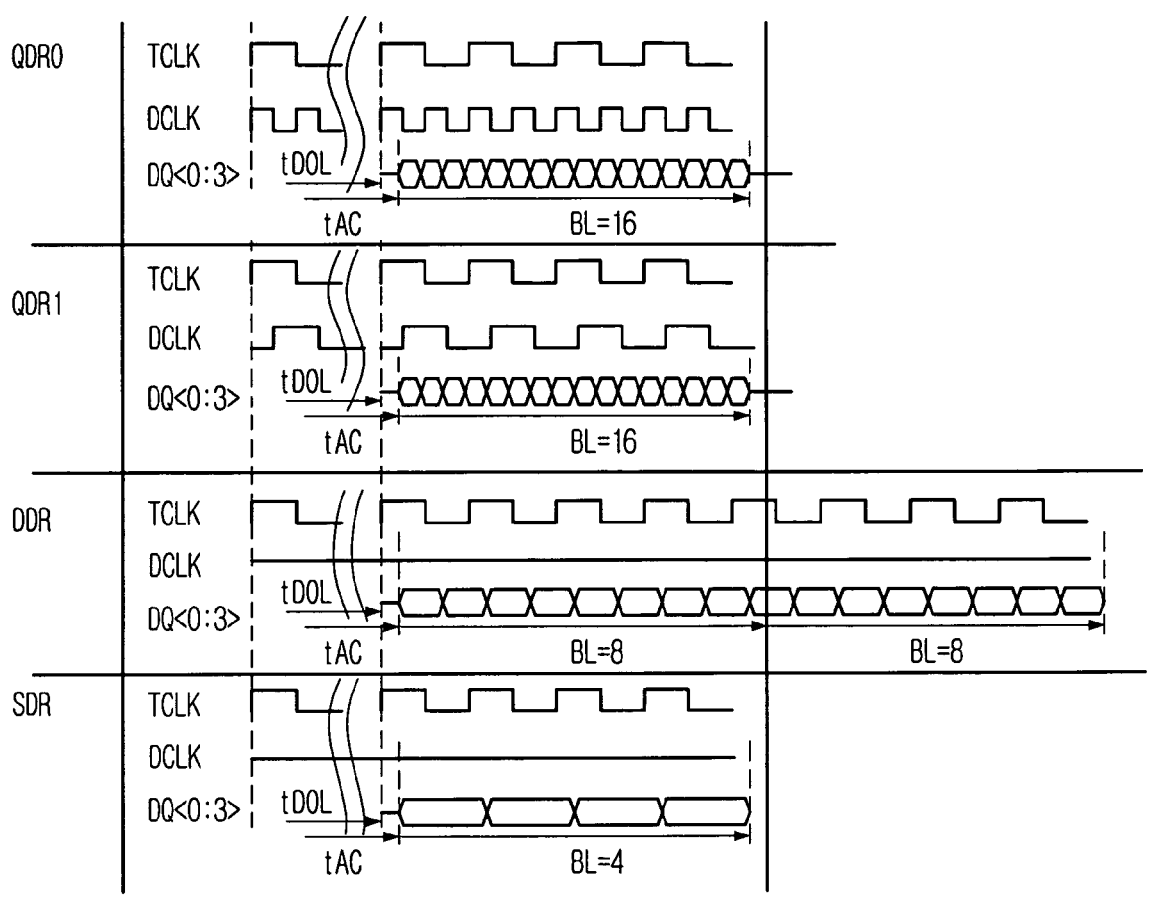
FIG. 12 is a diagram illustrating a read operation classified by various data transfer modes.

FIGS. 11 and 12 are diagrams illustrating the read and write operation classified by various data transfer modes.

Hereinafter, referring to FIGS. 11 and 12, the read and write operation of the multi-port memory device during the DRAM core test mode is explained in detail.

For reference, a first quadruple data rate (QDR) mode "QDR0" is selected when the first mode setting signal TQDR0 is activated, a second QDR mode "QDR1" is selected when the second mode setting signal TQDR1 is activated, a double data rate (DDR) mode "DDR" is selected when the third mode setting signal TDDR is activated, and a single data rate (SDR) mode "SDR" is selected when the fourth mode setting signal TSDR is activated.

In case of the first QDR mode "QDR0", if the first internal clock TCLK has a first period T, the second internal clock DCLK is configured to have a second period which is substantially the same as a half period T/2 of the first internal clock TCLK. Herein, the first internal clock signal TCLK is used as a reference clock of commands, addresses and control signals, and the second internal clock signal DCLK is used as a reference clock of I/O data signals. In the first QDR mode "QDR0", an I/O data signal group DQ<0:3> is input/output through the test pads DQi in synchronization with every rising and falling edge of the second internal clock signal DCLK.

In case of the second QDR mode "QDR1", the second internal clock DCLK has the first period T substantially the same as that of the first internal clock TCLK, and a delayed waveform by the half period T/2, i.e., a phase of the second internal clock DCLK is shifted by 90 degrees. In the second QDR mode "QDR1", the I/O data signal group DQ<0:3> is input/output through the test pads DQi in synchronization with every rising and falling edge of the first and second internal clock signals TCLK and DCLK. As a result, a data processing rate of the second QDR mode "QDR1" is the same as that of the first QDR mode "QDR0". Herein, the first internal clock signal TCLK is also used as the reference clock of the commands, the addresses and the control signals.

In case of the DDR mode "DDR", the second internal clock DCLK is fixed with a logic high level or a logic low level, or has the same waveform as the first internal clock signals TCLK. Herein, the second internal clock DCLK is fixed with the logic low level as an example. In such DDR mode "DDR", the I/O data signal group DQ<0:3> is input/output through the test pads DQi in synchronization with every rising and falling edge of the first internal clock signals TCLK. As a result, a data processing rate of the DDR mode "DDR" is a half of those of the first and second QDR modes "QDR0" and "QDR1". Herein, the first internal clock signal TCLK is also used as the reference clock of the commands, the addresses and the control signals.

In case of the SDR mode "SDR", the second internal clock DCLK is fixed with a logic high level or a logic low level. In the SDR mode "SDR", the I/O data signal group DQ<0:3> is input/output through the test pads DQi in synchronization with the rising or falling edge of the first internal clock signals TCLK. As a result, a data processing rate of the SDR mode "SDR" is a half of those of the DDR modes "DDR". Herein, the first internal clock signal TCLK is also used as the reference clock of the commands, the addresses and the control signals.

Referring to FIGS. 9 to 11, the write operation of the multi-port memory device is explained.

During the DRAM core test mode, if the mode register enable signal MREB is input with a logic low level from the external pad, the test I/O control unit 93 transfers the test signal input through the transmission pads TXi and the reception pads RXi to the first global data bus GIO_IN.

The mode setting unit 91 decodes the first and second data transfer mode selection signal DTT0 and DTT1 loaded on the first global data bus GIO_IN and outputs the first to fourth mode setting signals TQDR0, TQDR1, TDDR, and TSDR in response to the mode register enable signal MREB. Further, the mode setting unit 91 generates the bank selection signal BKEN by decoding the external control signal.

The clock generating unit 92 receives the external clock signal CLK and generates the first and second internal clock signals TCLK and DCLK in response to the first to fourth mode setting signals TQDR0, TQDR1, TDDR, and TSDR. Herein, the first and second internal clock signals TCLK and DCLK according to the data transfer mode such as the first and second QDR modes QDR0 and QDR1, the DDR mode, and the SDR mode are shown in FIG. 11.

The test I/O control unit 93 receives the input data signal through the test pads DQi in synchronization with the first and second internal clock signals TCLK and DCLK.

In particular, in the first QDR mode "QDR0", the test I/O control unit 93 receives the input data signal through the test pads DQi in synchronization with every rising and falling edge of the second internal clock signal DCLK. In the second QDR mode "QDR1", the test I/O control unit 93 receives it in synchronization with every rising and falling edge of the first and second internal clock signals TCLK and DCLK. In the DDR mode "DDR", the test I/O control unit 93 receives it in synchronization with every rising and falling edge of the first internal clock signal TCLK. In the SDR mode "SDR", the test I/O control unit 93 receives it in synchronization with one of the rising and falling edge of the first internal clock signal TCLK.

Further, the test I/O control unit 93 generates the write command WRITE by decoding the test signal input through the transmission pads TXi and the reception pads RXi, and transfers the input data signal input through the test pads DQi to the first global data bus GIO_IN in response to the write command WRITE. Herein, the test signal is input through the transmission pads TXi and the reception pads RXi in parallel in a 1-bit basis. If the bit number of the test signal is increasing, the bit number can be increased by adding dummy pads.

A corresponding bank controller receives the test signal and the input data signal loaded on the first global data bus GIO_IN in response to the bank selection signal BKEN output from the mode setting unit 91, and decodes the test signal to thereby generate a write command signal, specific row/column addresses of a memory cell of a core region for writing the input data signal.

The bank corresponding to the bank controller writes the input data signal to the specific row/column addresses of the memory cell in response to the write command signal output from the bank controller.

Referring to FIG. 12, the read operation of the multi-port memory device is explained.

The test I/O control unit 93 transfers the test signal input through the transmission pads TXi and the reception pads RXi to the first global data bus GIO_IN. Herein, the test signal corresponds to the read command READ.

The mode setting unit 91 decodes the first and second data transfer mode selection signal DTT0 and DTT1 loaded on the first global data bus GIO_IN and outputs the first to fourth mode setting signals TQDR0, TQDR1, TDDR, and TSDR in response to the mode register enable signal MREB. Further, the mode setting unit 91 generates the bank selection signal BKEN by decoding the external control signal.

The clock generating unit 92 receives the external clock signal CLK and generates the first and second internal clock signals TCLK and DCLK in response to the first to fourth mode setting signals TQDR0, TQDR1, TDDR, and TSDR. Herein, the first and second internal clock signals TCLK and DCLK according to the data transfer mode such as the first and second QDR modes QDR0 and QDR1, the DDR mode, and the SDR mode is shown in FIG. 12.

A corresponding bank controller receives the test signal loaded on the first global data bus GIO_IN in response to the bank selection signal BKEN, and decodes the test signal to thereby generate a read command signal, specific row/column addresses of the memory cell of the core region for reading the input data signal.

The bank corresponding to the bank controller read the output data signal from the specific row/column addresses of the memory cell in response to the read command signal, and transfers the output data signal to the test I/O control unit 93 through the second global data bus GIO_OUT.

The test I/O control unit 93 generates the read command READ by decoding the test signal, and outputs the output data signal to the test pads DQi in response to the read command READ in synchronization with the first and second internal clock signals TCLK and DCLK.

As shown in FIG. 12, the test I/O control unit 93 outputs the output data signal according to the data transfer mode such as the first and second QDR modes QDR0 and QDR1, the DDR mode, and the SDR mode. For the reference, a burst length "BL" means the bit number of the output data signal. A data output latency "tDOL" is a time section for performing the read operation for reading out data of the memory cell and has substantially the same value as the external clock signal CLK plus a cas latency CL, i.e., "CLK+CL". A delay "tAC" is a time from a starting point of the data output latency "tDOL" to a real reading point of data of the memory cell in consideration of a loading time by a local data bus located on the core region.

In particular, in the first QDR mode "QDR0", the test I/O control unit 93 outputs the output data signal to the test pads DQi in synchronization with every rising and falling edge of the second internal clock signal DCLK. For example, if the bank is divides into four quarters with a 16-bit burst length, i.e., BL=16, the output data signal is output in a 4-bit basis per each quarter in sequence.

In the second QDR mode "QDR1", the test I/O control unit 93 outputs the output data signal in synchronization with every rising and falling edge of the first and second internal clock signals TCLK and DCLK.

In the DDR mode "DDR", the test I/O control unit 93 outputs the output data signal in synchronization with every rising and falling edge of the first internal clock signal TCLK. For example, the input data signal is simultaneously written to two memory cells for 4 clocks with an 8-bit burst length, i.e., BL=8. During the read operation, the output data signal is output by dividing 4-bit data of each quarter in a 2-bit basis. Herein, a prior 8-bit input data signal and a posterior 8-bit input data signal are substantially the same data pattern. A duration of the read operation is expanded into 4-clock more than those of the first and second QDR modes "QDR0" and "QDR1", and the SDR mode "SDR".

In the SDR mode "SDR", the test I/O control unit 93 outputs the output data signal in synchronization with one of the rising and falling edge of the first internal clock signal TCLK. For example, the 4-bit data of each quarter having substantially the same input data signal are written to the memory cell with a 4-bit burst length, i.e., BL=4. During the read operation, the 4-bit data of each quarter is compressed and the output data signal is output with a logic low or high level according to a state of the compressed data, i.e., pass or fail.

As described above, the multi-port memory device in accordance with the present invention uses a parallel I/O interface during the DRAM core test mode and supports various I/O data transfer modes such as the SDR, the DDR and the QDR. As a result, it is possible to reduce a time for testing the multi-port memory device by selectively performing the DRAM core test based on the I/O data transfer modes.

Although the description has been made of the multi-port memory device including four ports and eight banks, the present invention is not limited to this structure. That is, the present invention can be applied to any multi-port memory device performing a serial data communication between a plurality of ports and external devices, and performing a parallel data communication between a plurality of banks and the ports. Moreover, there are no limitations on positions of the ports and banks.

Further, it is possible to generate the first and second internal clock signals TCLK and DCLK by receiving two external clock signals, not one clock signal CLK. In this time, each of two external clock signals has the same waveform as that of the first and second internal clock signals TCLK and DCLK, respectively.

The present invention can be applied to any multi-port memory device such as a general DRAM device which performs a parallel data communication between a plurality of banks and the ports.

The present application contains subject matter related to Korean patent application No. 2006-33749, filed in the Korean Intellectual Property Office on Apr. 13, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
a plurality of first pads;
a plurality of ports for performing a serial data communication with external devices through the first pads;
a plurality of banks for performing a parallel data communication with the plurality of ports;
a plurality of global data buses for supporting the parallel data communication between the plurality of ports and the plurality of banks; and
a test mode controller for performing a core test by converting the serial data communication into the parallel data communication during a selected core test mode,
wherein the test mode controller includes a mode setting unit for receiving a data transfer mode selection signal input through the global data buses and generating a mode setting signal in response to a mode register enable signal enabled during the core test mode.

2. The semiconductor memory device of claim 1, wherein the test mode controller further includes:
a clock generating unit for receiving an external clock signal and generating first and second internal clock signals in response to the mode setting signal; and
a test input/output (I/O) control unit for bypassing a test signal input through the first pads in parallel to the global buses, and transferring an I/O data signal between a plurality of second pads and the banks through the global data buses in response to the mode register enable signal in synchronization with the first and second internal clock signals.

3. The semiconductor memory device of claim 2, wherein the mode setting signal determines a data transfer mode of the I/O data signal.

4. The semiconductor memory device of claim 3, wherein the first and second internal clock signals synchronize command signals, address signals, and the I/O data signal to have a data transfer rate corresponding to the data transfer mode.

5. The semiconductor memory device of claim 2, wherein the first internal clock signal is used as a reference clock of the command signals and the address signals generated and used during the core test mode.

6. The semiconductor memory device of claim 2, wherein the second internal clock signal is used as a reference clock of the I/O data signal input and output through the second pads during the core test mode.

7. The semiconductor memory device of claim 3, wherein the first internal clock signal has substantially the same waveform regardless of the data transfer mode.

8. The semiconductor memory device of claim 7, wherein the second internal clock signal has a different waveform according to the data transfer mode.

9. The semiconductor memory device of claim 8, wherein the second internal clock signal has a half period of the first internal clock signal.

10. The semiconductor memory device of claim 9, wherein the test I/O control unit inputs and outputs the I/O data signal through the second pads in synchronization with every rising and falling edge of the second internal clock signal.

11. The semiconductor memory device of claim 8, wherein the second internal clock signal has substantially the same period as the first internal clock and a phase shifted by 90 degrees in comparison with the first internal clock signal.

12. The semiconductor memory device of claim 11, wherein the test I/O control unit inputs and outputs the I/O data signal through the second pads in synchronization with every rising and falling edge of the first and second internal clock signals.

13. The semiconductor memory device of claim 8, wherein the second internal clock signal maintains one of a logic low level and a logic high level regardless of the first internal clock signal.

14. The semiconductor memory device of claim 13, wherein the test I/O control unit inputs and outputs the I/O data signal through the second pads in synchronization with every rising and falling edge of the first internal clock signal.

15. The semiconductor memory device of claim 13, wherein the test I/O control unit inputs and outputs the I/O data signal through the second pads in synchronization with every rising or falling edge of the first internal clock signal.

16. The semiconductor memory device of claim 7, wherein the second internal clock signal has substantially the same waveform as that of the first internal clock signal.

17. The semiconductor memory device of claim 16, wherein the test I/O control unit inputs and outputs the I/O data signal through the second pads in synchronization with every rising and falling edge of the second internal clock signal.

18. The semiconductor memory device of claim 16, wherein the test I/O control unit inputs and outputs the I/O data signal through the second pads in synchronization with every rising or falling edge of the second internal clock signal.

19. The semiconductor memory device of claim 2, wherein the global data buses include: a first bus for transferring the test signal input through the first pads and the input data signal input through the second pads to the banks; and a second bus for transferring the output data signal output from the banks to the second pads.

20. The semiconductor memory device of claim 19, wherein, during the core test mode, the test I/O control unit decodes the test signal to generate a write command and a read command, transfers the input data signal from the second pads to the first bus in response to the write command, and transfers the output data signal from the second bus to the second pads in response to the read command.

21. The semiconductor memory device of claim 19, wherein the test I/O control unit includes: a command decoder for decoding the test signal input through the first pads to generate a write command and a read command, and buffering the input data signal input through the second pads in response to the mode register mode enable signal; a demultiplexer for transferring the buffered input data signal to the first bus in response to the write command; and a multiplexer for receiving the output data signal from the second bus to output the output data signal to the second pads in response to the read command.

22. The semiconductor memory device of claim 21, wherein the test I/O control unit further includes a tri-state buffer for selectively buffering the output data signal output from the multiplexer and bypassing the input data signal input through the second pads to the command decoder, in response to a buffer control signal output from the command decoder.

23. A semiconductor memory device, comprising: a mode setting unit for generating a mode setting signal in response to a mode register enable signal input through a plurality of first pads in parallel during a core test mode; a clock generating unit for receiving an external clock signal and generating first and second internal clock signals in response to the mode setting signal; and a test input/output (I/O) control unit for controlling an input and output of an input/output (I/O) data signal through a plurality of second pads during the core test mode in synchronization with the first and second internal clock signals.

24. The semiconductor memory device of claim 23, wherein the mode setting signal determines a data transfer mode of the I/O data signal which is input and output through the second pads.

25. The semiconductor memory device of claim 24, wherein the first and second internal clock signals synchronize command signals, address signals, and the I/O data signal has a data transfer rate corresponding to the data transfer mode.

26. The semiconductor memory device of claim 23, wherein the first internal clock signal is used as a reference clock for the command signals and the address signals generated and used during the core test mode.

27. The semiconductor memory device of claim 23, wherein the second internal clock signal is used as a reference clock of the I/O data signal input and output through the second pads during the core test mode.

28. The semiconductor memory device of claim 24, wherein the first internal clock signal has substantially the same waveform regardless of the data transfer modes.

29. The semiconductor memory device of claim 28, wherein the second internal clock signal has a different waveform according to the data transfer modes.

30. The semiconductor memory device of claim 29, wherein the second internal clock signal has a half period of the first internal clock signal.

31. The semiconductor memory device of claim 30, wherein the test I/O control unit inputs and outputs the I/O data signal through the second pads in synchronization with every rising and falling edge of the second internal clock signal.

32. The semiconductor memory device of claim 29, wherein the second internal clock signal has substantially the same period as the first internal clock and a phase shifted by 90 degrees in comparison with the first internal clock signal.

33. The semiconductor memory device of claim 32, wherein the test I/O control unit inputs and outputs the I/O data signal through the second pads in synchronization with every rising and falling edge of the first and second internal clock signals.

34. The semiconductor memory device of claim 29, wherein the second internal clock signal maintains one of a logic low level and a logic high level regardless of the first internal clock signal.

35. The semiconductor memory device of claim 34, wherein the test I/O control unit inputs and outputs the I/O data signal through the second pads in synchronization with every rising and falling edge of the first internal clock signal.

36. The semiconductor memory device of claim 34, wherein the test I/O control unit inputs and outputs the I/O data signal through the second pads in synchronization with every rising or falling edge of the first internal clock signal.

37. The semiconductor memory device of claim 28, wherein the second internal clock signal has substantially the same waveform as the first internal clock signal.

38. The semiconductor memory device of claim 37, wherein the test I/O control unit inputs and outputs the I/O data signal through the second pads in synchronization with every rising and falling edge of the second internal clock signal.

39. The semiconductor memory device of claim 37, wherein the test I/O control unit inputs and outputs the I/O data signal through the second pads in synchronization with every rising or falling edge of the second internal clock signal.

* * * * *